(12) United States Patent
Beyne

(10) Patent No.: US 11,462,420 B2
(45) Date of Patent: Oct. 4, 2022

(54) METHOD FOR PACKAGING SEMICONDUCTOR DIES

(71) Applicant: IMEC vzw, Leuven (BE)

(72) Inventor: Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 224 days.

(21) Appl. No.: 16/601,436

(22) Filed: Oct. 14, 2019

(65) Prior Publication Data
US 2020/0118840 A1  Apr. 16, 2020

(30) Foreign Application Priority Data

Oct. 15, 2018 (EP) ..................................... 18200449

(51) Int. Cl.
*H01L 21/56* (2006.01)
*H01L 23/31* (2006.01)
*H01L 23/473* (2006.01)

(52) U.S. Cl.
CPC .......... *H01L 21/568* (2013.01); *H01L 21/561* (2013.01); *H01L 23/3192* (2013.01); *H01L 23/473* (2013.01)

(58) Field of Classification Search
None
See application file for complete search history.

(56) References Cited

U.S. PATENT DOCUMENTS

| 2008/0308919 | A1  | 12/2008 | Obata et al. |
| 2010/0003789 | A1* | 1/2010  | Caplet ................. B81C 1/00285 |
|              |     |         | 257/E21.502 |
| 2013/0066045 | A1* | 3/2013  | Bellan .................. C09D 193/02 |
|              |     |         | 530/201 |
| 2015/0206813 | A1* | 7/2015  | Gandhi .................... H01L 25/50 |
|              |     |         | 438/109 |
| 2017/0152137 | A1* | 6/2017  | Pornin ................ B81C 1/00333 |
| 2017/0287736 | A1  | 10/2017 | Oster et al. |

OTHER PUBLICATIONS

Extended European Search Report dated May 3, 2019 in EP Application No. 18200449.9.

(Continued)

*Primary Examiner* — Jay C Chang
(74) *Attorney, Agent, or Firm* — Knobbe Martens Olson & Bear LLP

(57) ABSTRACT

A method for packaging semiconductor dies by overmolding is disclosed. The dies are embedded in a substrate of a mold material, and cavities are produced in the mold substrate by producing 3D structures of a sacrificial material prior to the overmolding step. Afterwards, the sacrificial material is removed to thereby create cavities in the mold substrate. A conformal layer is produced on the 3D structures prior to overmolding, and the mold substrate is thinned to expose an upper surface of the 3D structures. The conformal layer is not removed when the sacrificial structures are removed. In this way, the conformal layer remains on the surfaces of the mold substrate inside the cavity. In one aspect, the conformal layer may have a protective function, useful in the production of packages including dies which come into contact with fluid substances.

19 Claims, 10 Drawing Sheets

(56) References Cited

OTHER PUBLICATIONS

Hochst et al., Stable Thin Film Encapsulation of Acceleration Sensors Using Polycrystalline Silicon as Sacrificial and Encapsulation Layer, Sensors and Actuators A: Physical, Mar. 2004, vol. 114, pp. 355-361.
Jin et al., Next Generation eWLB (embedded Wafer Level BGA) Packaging, 2010 12th Electronics Packaging Technology Conference, 2010, pp. 520-526.
Sochol et al., 3D Printed Microfluidics and Microelectronics, Microelectronic Engineering, Dec. 2017, vol. 189, pp. 52-68.
Tiedje et al., Will Low-Cost 3D Additive Manufactured Packaging Replace the Fan-Out Wafer Level Packages?, 2017 IEEE 67th Electronic Components and Technology Conference, 2017, pp. 1065-1070.
Wu et al., 3D-Printed Microelectronics for Integrated Circuitry and Passive Wireless Sensors, Microsystems & Nanoengineering, Jul. 2015, pp. 1-9.

\* cited by examiner

METHOD FOR PACKAGING SEMICONDUCTOR DIES

CROSS-REFERENCE TO RELATED APPLICATIONS

This application claims foreign priority to European Patent Application No. 18200449.9, filed Oct. 15, 2018, the contents of which are incorporated by reference herein in its entirety.

BACKGROUND

Technological Field

The disclosed technology is related to semiconductor package processing using overmolding techniques.

Description of the Related Technology

Overmolding has been extensively applied in semiconductor packaging. Wafer-level molding technology is used to reconstruct a wafer or panel shaped substrate, which allows for the creation of thin film package-level interconnects in a redistribution layer (RDL). This technology is known as Fan-Out Wafer Level Packaging (FO-WLP) or embedded Wafer Level Ball Grid Array (eWLB) as illustrated, for example, in the article "Next Generation eWLB (embedded wafer level BGA) Packaging" by Yonggang Jin et al., Proceedings of Electronics Packaging Technology Conference (EPTC), 2010. Overmolding steps applied in this technology involve the application of a mold material on a wafer including semiconductor dies and curing the mold material, thereby embedding the dies in a solid mold substrate.

U.S. Patent Publication No. 2017/0287736 discloses a method wherein 3D structures of a sacrificial material are produced prior to the application of the mold material. The sacrificial structures may be produced by 3D printing. After curing and setting of the mold material, the sacrificial structures are removed, thus creating cavities in the mold material. A problem with the latter approach is that the interior of the cavities in the mold material may not be resistant to certain fluid substances, which may be required to come into contact with the package in a number of applications, such as in the case of biosensing dies, for example.

SUMMARY OF CERTAIN INVENTIVE ASPECTS

The disclosed technology aims to provide a solution to the above-named problems. The disclosed technology is related to a method for packaging semiconductor dies by overmolding, wherein the dies are embedded in a substrate of a mold material, and wherein cavities are produced in the mold substrate by producing 3D structures of a sacrificial material prior to the overmolding step. Afterwards, the sacrificial material is removed to thereby create cavities in the mold substrate. According to embodiments of the disclosed technology, a conformal layer is produced on the 3D structures prior to overmolding, and the mold substrate is thinned to expose an upper surface of the 3D structures. The conformal layer is not removed when the sacrificial structures are removed. In this way, the conformal layer remains on the surfaces of the mold substrate inside the cavity. The conformal layer may have a protective function, useful in the production of packages including dies which come into contact with particular fluid substances.

According to an embodiment, the disclosed technology relates to a method for packaging one or more semiconductor dies. The method includes providing a base substrate and thereafter performing one or more overmolding steps on the base substrate to produce one mold substrate, or a stack of mold substrates, on the base substrate. One or more dies are embedded in one or more of the mold substrates. The method includes:

providing one or more 3-dimensional structures of a sacrificial material on a surface of the base substrate, forming a conformal layer at least on the one or more 3-dimensional structures, performing a first overmolding step, thereby embedding the one or more 3-dimensional sacrificial structures in a first mold substrate, thinning at least part of the first mold substrate, thereby removing the conformal layer from an upper surface of the one or more 3-dimensional sacrificial structures, thereby exposing the 3-dimensional sacrificial structures, removing the sacrificial material of the one or more 3-dimensional structures whose upper surfaces are exposed, while maintaining the conformal layer, thereby obtaining one or more cavities in the first mold substrate, wherein the conformal layer covers every surface of the first mold substrate inside the one or more cavities.

According to an embodiment, the base substrate includes a carrier substrate and a temporary adhesive layer on the carrier substrate.

According to an embodiment, the base substrate also includes one or more of the semiconductor dies, the dies being removably attached to the temporary adhesive layer.

According to an embodiment, the base substrate also includes a redistribution layer that is removably attached to the temporary adhesive layer, and one or more of the semiconductor dies, the dies being bonded to the redistribution layer.

According to an embodiment, the base substrate also includes a conformal layer at least on the area where the one or more 3-dimensional structures are formed, and wherein the conformal layer on the base substrate remains after the removal of the one or more 3-dimensional structures.

The method of the disclosed technology may also include, after the thinning step and before the step of removing the sacrificial material:

providing at least one additional 3-dimensional structure formed of a sacrificial material on the thinned surface of the first mold substrate, in direct contact with an exposed surface of a previous 3-dimensional structure embedded in the first mold substrate, and wherein the footprint of the additional structure does not extend beyond the exposed surface of the previous structure, forming an additional conformal layer, at least on the one or more additional 3-dimensional structures and on any exposed surface of the previous 3-dimensional structure or structures not contacted directly by the one or more additional 3-dimensional structures, performing a second overmolding step, thereby embedding the one or more additional 3-dimensional structures in a second mold substrate produced on the first mold substrate, thinning at least part of the second mold substrate, thereby removing at least the additional conformal layer from an upper surface of one or more of the additional 3-dimensional structures, possibly repeating the above steps on the second mold substrate and possibly on one or more subsequent mold substrates, and wherein the step of removing the sacrificial material takes place simultaneously for the first and second mold substrates and possible subsequent mold substrates, thereby creating at least one aggregate cavity extending across the mold substrates, and wherein a conformal layer covers every surface of the first and second mold substrate and possibly any subsequent mold substrate, inside the aggregate cavity.

According to another embodiment, the method also includes, after the thinning step and before the step of removing the sacrificial material:

forming an intermediate layer on the thinned surface of the first mold substrate, the intermediate layer covering at least one area extending beyond the exposed surface of a 3-dimensional structure formed of sacrificial material, while not covering any exposed surface of the 3-dimensional structures, providing at least one additional 3-dimensional structure formed of a sacrificial material on the thinned surface of the first mold substrate, in direct contact with an exposed surface of a previous 3-dimensional structure embedded in the first mold substrate, wherein a part of the footprint of the additional structure extends beyond the exposed surface of the previous structure, and wherein the extending part of the footprint is formed on the intermediate layer, forming an additional conformal layer, at least on the one or more additional 3-dimensional structures and on any exposed surface of the previous 3-dimensional structure or structures not contacted directly by the one or more additional 3-dimensional structures, performing a second overmolding step, thereby embedding the one or more additional 3-dimensional structures in a second mold substrate produced on the first mold substrate, thinning at least part of the second mold substrate, thereby removing at least the additional conformal layer from an upper surface of one or more of the additional 3-dimensional structures, possibly repeating the above steps on the second mold substrate and possibly on one or more subsequent mold substrates, and wherein the step of removing the sacrificial material takes place simultaneously for the first and second mold substrates and possible subsequent mold substrates, thereby creating at least one aggregate cavity extending across the mold substrates, and wherein a conformal layer covers every surface of the first and second mold substrate and possibly any subsequent mold substrate, inside the aggregate cavity.

According to an embodiment, the aggregate cavity forms a fluid channel network. The network may be configured for supplying a cooling liquid to one or more semiconductor dies.

The one or more thinning steps may include grinding the surface of the mold substrate or substrates. The 3D structures may be produced by 3D printing. The conformal layer and—if applicable—the one or more additional conformal layers and the intermediate layer may be moisture barriers.

The disclosed technology is also related to a package including one or more semiconductor dies embedded in a mold material, wherein the package includes one or more open cavities in the mold material, the cavities including a conformal layer on every surface of the mold material inside the one or more cavities. The conformal layer in a package according to the disclosed technology may be a moisture barrier.

DETAILED DESCRIPTION OF CERTAIN ILLUSTRATIVE EMBODIMENTS

Figure 1A:
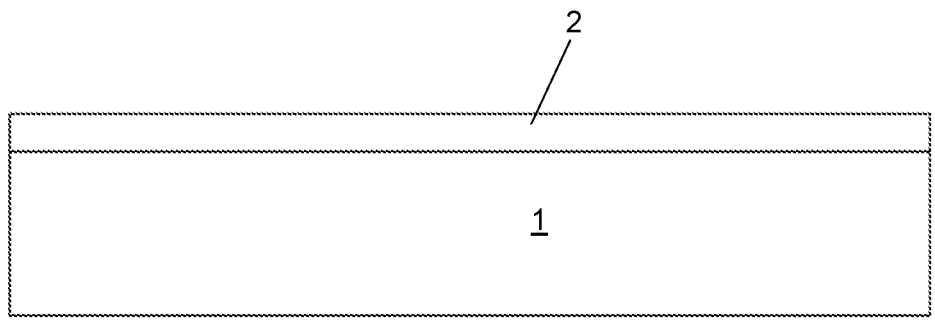
FIGS. 1A to 1I illustrate a sequence of steps for producing a package including a biosensing die in accordance with the disclosed technology.
Figure 1B:
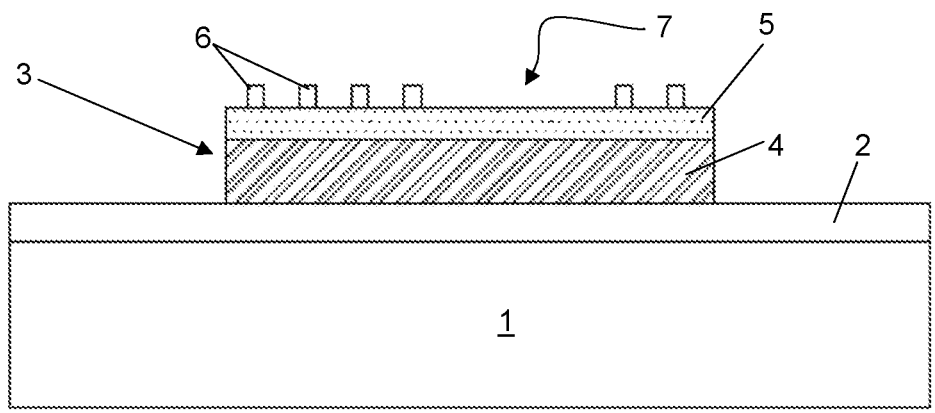

FIG. 1A shows a substrate 1 covered with a temporary adhesive layer 2. Any type of temporary carrier 1 and adhesive 2 known as suitable for the construction of fan-out wafer level packages may be used, for example a silicon or glass wafer 1 with the adhesive 2 applied thereto by soft baking or spin coating. As seen in FIG. 1B, a semiconductor die 3 is removably attached to the adhesive. The die includes a semiconductor substrate portion 4 and an active portion 5, with solder bumps 6 on top of the active portion 5. The active portion 5 is typically formed of a front end of line part including active devices processed on the semiconductor substrate portion 4, and a back end of line part including interconnects between the active devices and the solder bumps 6. Instead of solder bumps extending outward from the surface, the die may be provided with planar contact pads or other suitable contact structures. The side of the die including the bumps 6 or equivalents is referred to as the front side of the die.

As seen in FIG. 1B, the die 3 is attached with its back side to the adhesive 2. In this example, the die 3 is a biosensor including an open area 7 designed to come into contact with a liquid or gaseous substance. The area 7 may have a rectangular surface. The substrate 1 and temporary adhesive 2 together with the attached die 3 represent the "base substrate" referenced herein. The "surface of the base substrate" may thus include a topography defined by the outer surface of dies or other fixed 3D structures attached to a plane surface, which may be the surface of the temporary adhesive layer 2, or the surface of a previous mold substrate in a stack of mold substrates (as described in further detail below).

Figure 1C:
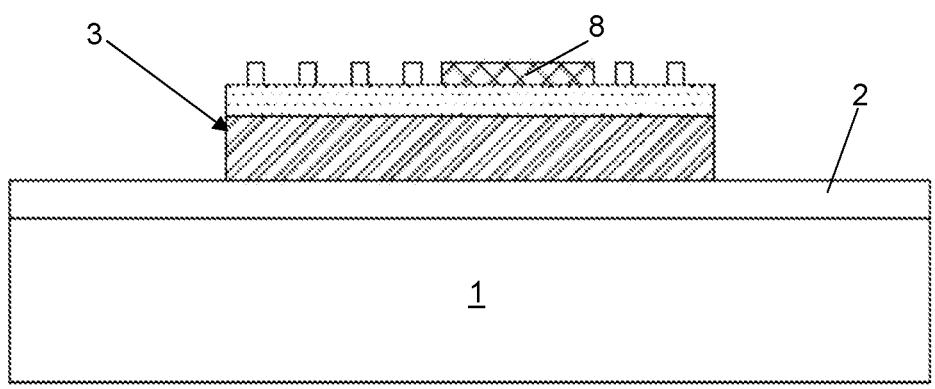

In accordance with the disclosed technology, a patch 8 of sacrificial material is formed on the outer surface of the base substrate, in this case in the open area 7 of the die 3. See FIG. 1C. The patch 8 covers the open area 7 of the die or at least a portion thereof, sufficient in any case for defining an active sensing area on the die. The thickness of the sacrificial material patch 8 may be similar to the bump height as shown in FIG. 1C, but it may also be higher, or even slightly lower. The patch 8 may be produced by 3D printing, stencil printing, lithography and etching, or any other suitable technique. The sacrificial material is a material that may be removed by wet etching or solvent removal after the structures have been embedded in a mold material, in any suitable manner, for example as described in U.S. Patent Publication No. 2017/0287736. The sacrificial material may, for example, be a polymer, a temporary bonding adhesive, or a metal.

Figure 1D:
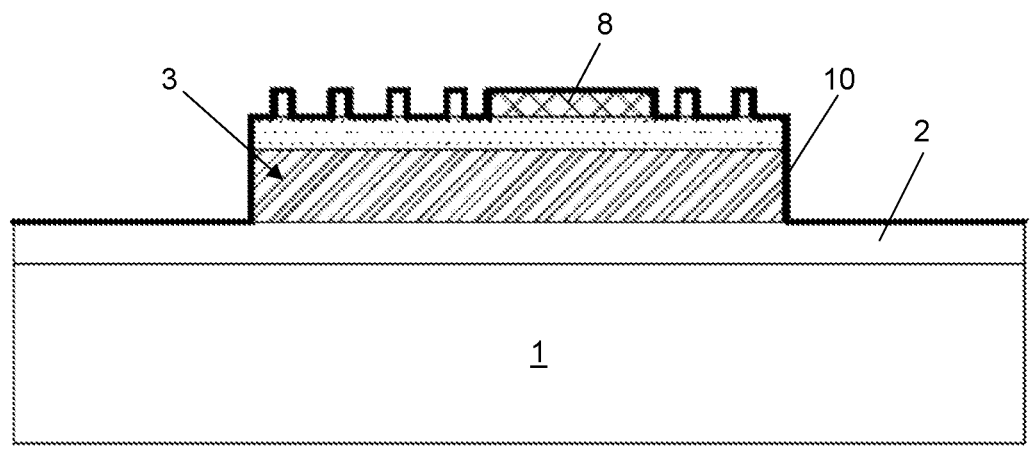

In a step that is characteristic to methods of the disclosed technology, a film 10 is then applied on the substrate 1. See FIG. 1D. In the drawings, this thin film is shown to be a conformal layer that covers every side wall and upper surface of every feature of the topography defined by the die 3, the bumps 6, and the sacrificial material patch 8. The layer 10 need not be 100% conformal in terms of having the same thickness everywhere, but it is applied so that it follows the topography, having a minimum thickness on every exposed surface, vertical (e.g., the sidewalls of the patch 8) as well as horizontal (e.g., the upper surface of the patch 8). As used herein, the layer is referred to as conformal, but it is emphasized that the interpretation of this term within the present context is as stated above. In one non-limiting example, the minimum required thickness of the conformal layer is about 10 nm.

The thin layer 10 may be a thin inorganic layer such as a $SiO_2$ layer or a $Si_3N_4$ layer, applied by chemical vapour deposition (CVD) or Plasma Enhanced Atomic Layer Deposition (PEALD). According to one embodiment, the thin layer 10 is a moisture barrier, for example a Parylene™ layer applied at room temperature. In the context of the disclosed technology, a moisture barrier may be any material that prevents a liquid or gaseous substance, or any compound within the substance, to enter the mold substrate. The moisture barrier may furthermore prevent the material of the mold substrate or any compounds within the material to enter the cavity. The thin layer 10 is resistant to at least one removal technique for removing the sacrificial material of the patch 8.

Figure 1E:
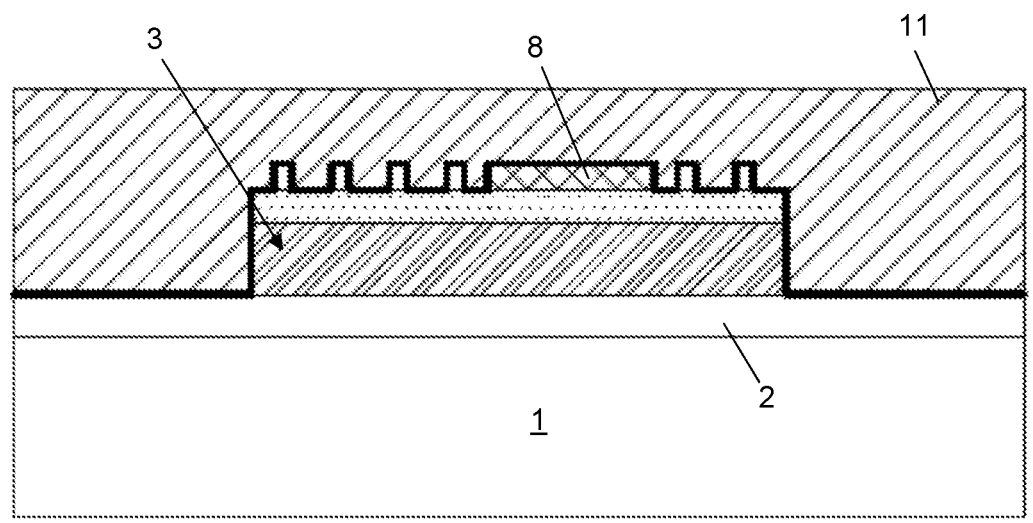
Figure 1F:
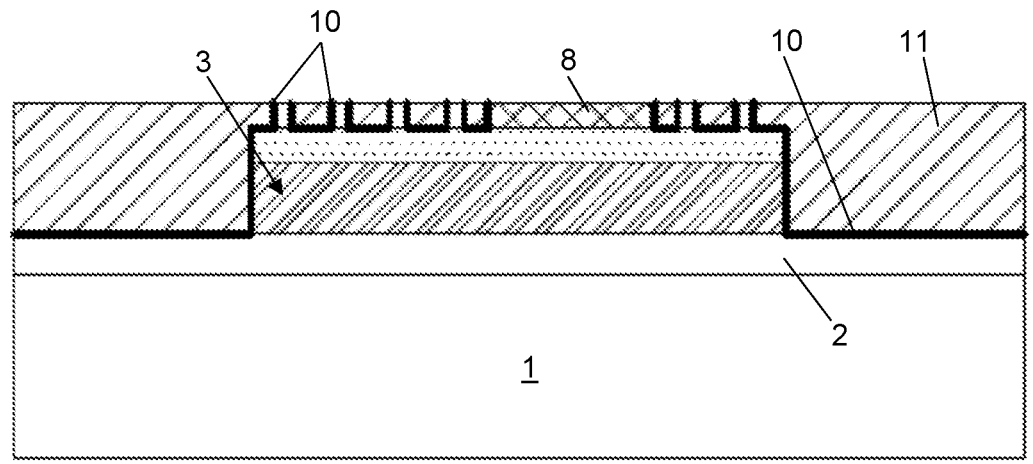

In the next step illustrated in FIG. 1E, a mold substrate 11 is produced on the substrate 1. Compression molding or transfer molding may be applied by deposition of a mold compound that is typically a mixture of particles and a thermosetting polymer, for example a thermosetting polymer with >80% silica particles. After application of the mold compound on the substrate 1, a post-mold curing step is applied to obtain a fully set mold substrate 11 embedding the die 3 and equally embedding the sacrificial patch 8, i.e., the patch is fully surrounded laterally and on top by the mold material. The mold substrate 11 is then thinned and planarized by a grinding step, as shown in FIG. 1F, to a thickness wherein an upper surface of the sacrificial material patch 8 and the microbumps 6 are exposed. If the initial thickness of the patch 8 was higher than the bumps 6, this means that part of the patch 8 itself is removed by the grinding. After the grinding, at least a portion of the patch 8 remains, with the layer 10 intact on its sidewalls. The grinding of a mold substrate can be performed using any suitable method, using for example a tool equipped with a rotatable grinding surface coated with a diamond powder. Other planarization techniques such as chemical mechanical polishing may be used instead of or in addition to the grinding step.

Figure 1G:
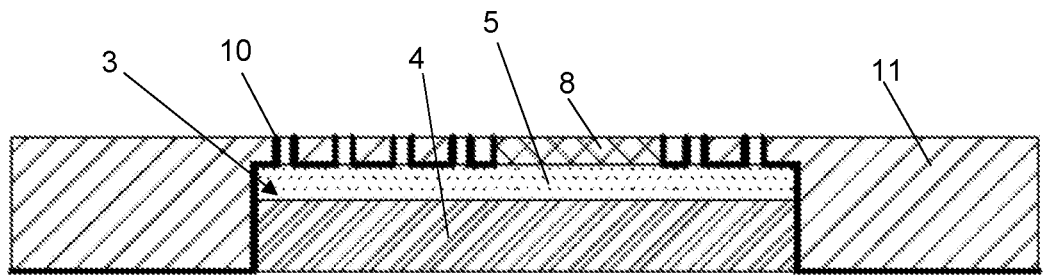
Figure 1H:
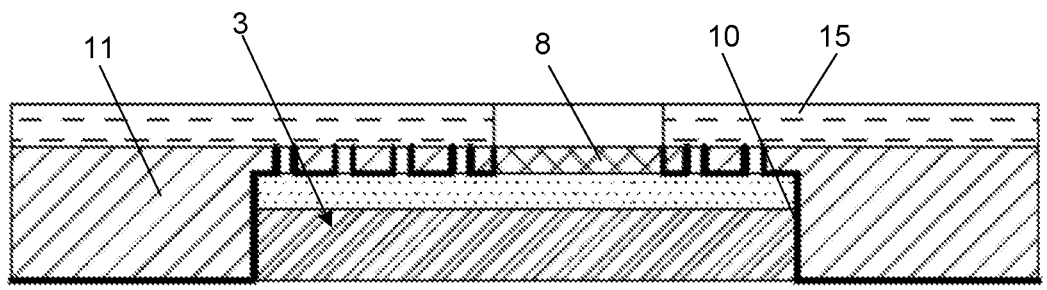
Figure 1I:
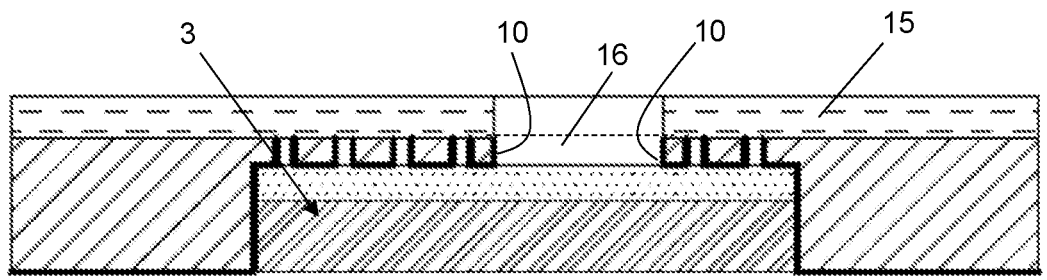

The mold substrate 11 is now released from the temporary adhesive layer 2 and thereby from the carrier substrate 1 by a debonding process, for example by peeling or by laser debonding. See FIG. 1G. As shown in FIG. 1H, a redistribution layer ("RDL") 15 is then applied for connecting the bumps 6 of the die 3 to other dies embedded in the mold substrate 11 and/or to packages which may afterwards be bonded on top of the package. The redistribution layer 15 includes one or more levels of metal interconnects embedded in a dielectric material, similar in structure to the back end of line part of a semiconductor die. The RDL 15 is applied so that an open area remains above the patch 8 of sacrificial material. The sacrificial material of the patch 8 is then removed by a suitable technique, such as by a solvent-aided removal, by heating and melting the sacrificial material, or by etching. See FIG. 1I. Removal of the sacrificial material takes place through the exposed upper surface of the patch 8. The removal technique is chosen so that only the sacrificial patch 8 is removed. The layer 10 remains intact, thereby defining a sensing cavity 16 above the die and open to the surface of the mold substrate 11. The cavity 16 is defined as the cavity in the mold substrate 11 (i.e., not including the upper portion surrounded by the RDL 15). The vertical walls of the cavity 16 are covered by the layer 10. The result is a reconstructed wafer including a packaged biochip 3 having a sensing area that forms the bottom of a cavity 16 formed in the mold substrate 11, wherein the sidewalls of the cavity 16 are covered by the thin layer 10. If the thin layer 10 is a moisture barrier, this is advantageous for protecting the mold material against possibly aggressive compounds in the tested fluids. The reconstructed wafer is then singulated to form separate packages. Alternatively, applying the RDL 15, removing the sacrificial patch 8, and possibly singulating the reconstructed wafer may be done prior to releasing the mold substrate from the temporary adhesive layer 2.

By exposing the upper surface of the patch 8, the thinning step enables removal of the patch 8 while the layer 10 remains on the sidewalls of the opening created by the removal. The combined application of the conformal layer 10 and the thinning step thereby enables the creation of cavities in the mold substrate 11 which have a thin protective layer on the surfaces of the mold substrate inside the cavity.

Figure 2A:
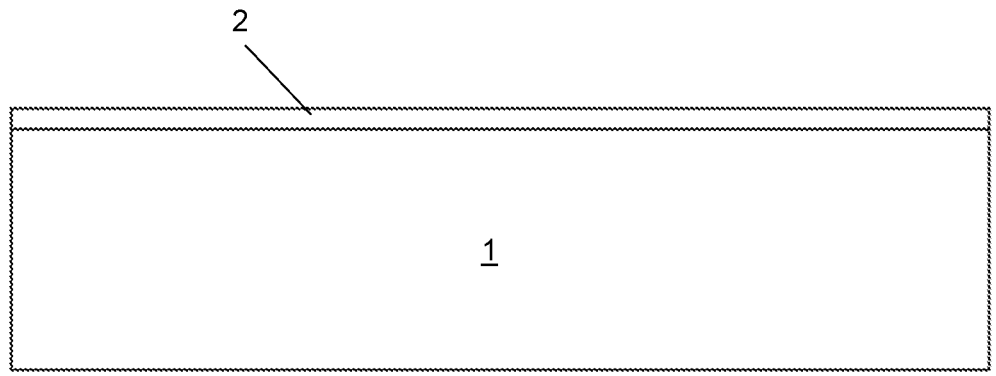
FIGS. 2A to 2M illustrate a sequence of steps for producing a package including a die and channels for cooling the die, in accordance with the disclosed technology.
Figure 2B:
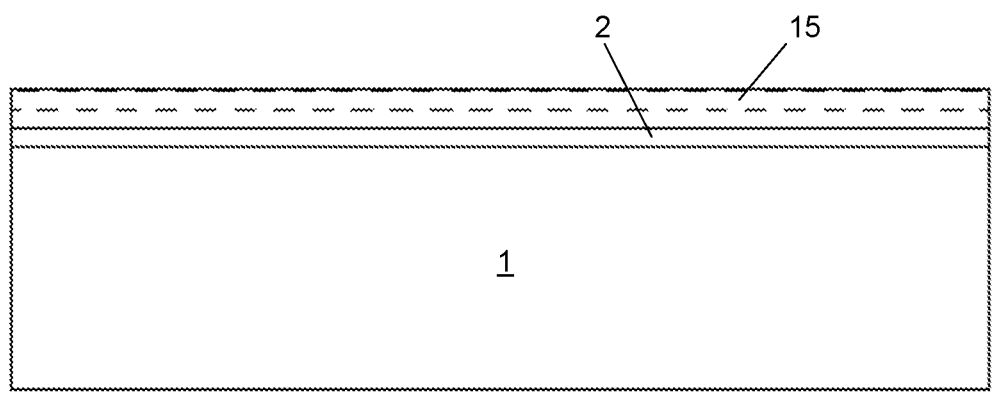
Figure 2C:
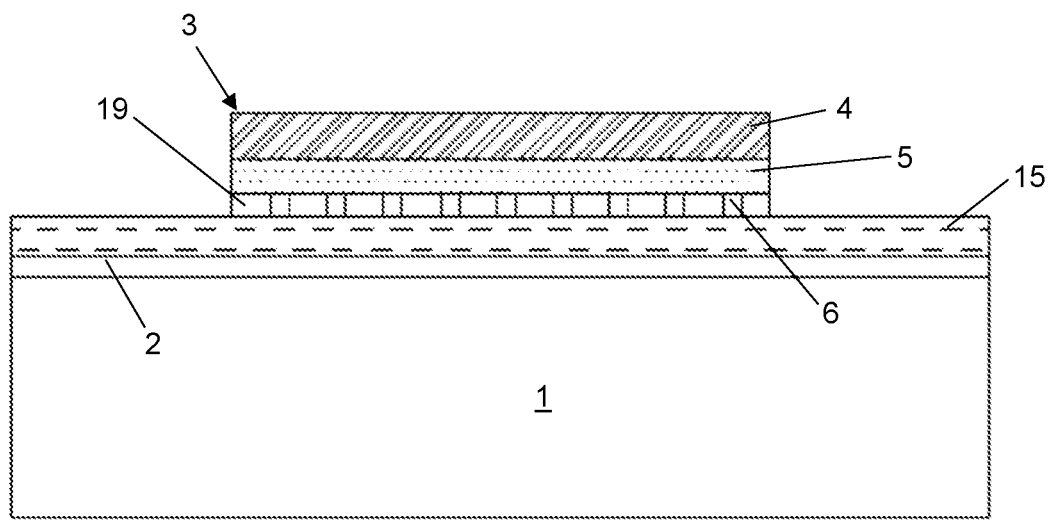
Figure 2D:
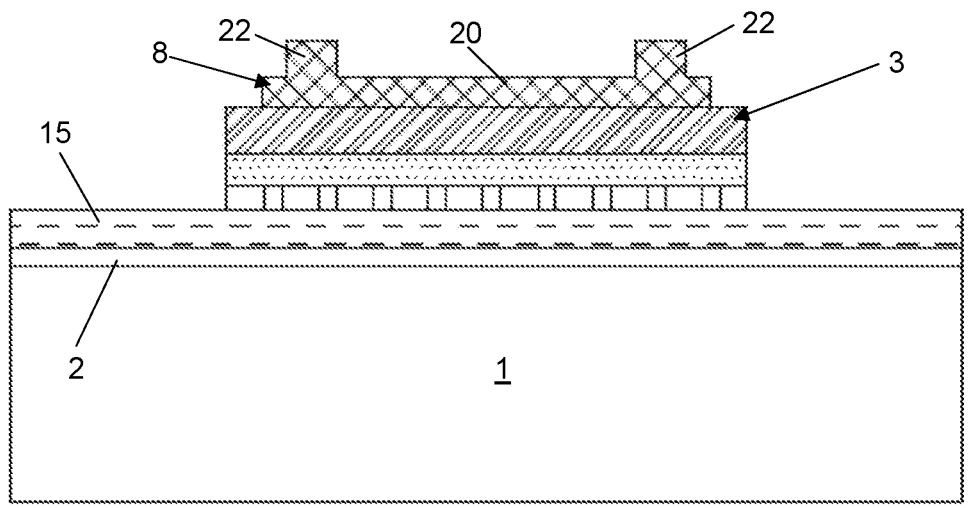
Figure 2E:
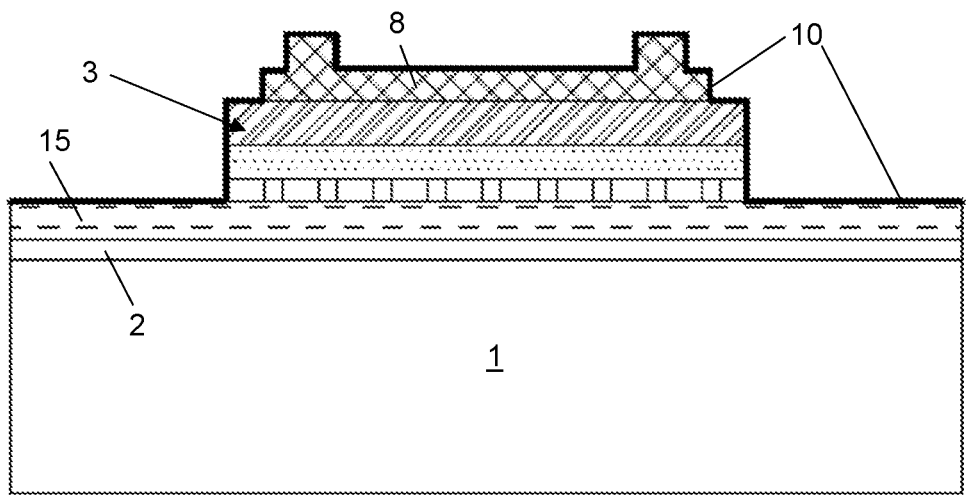
Figure 2F:
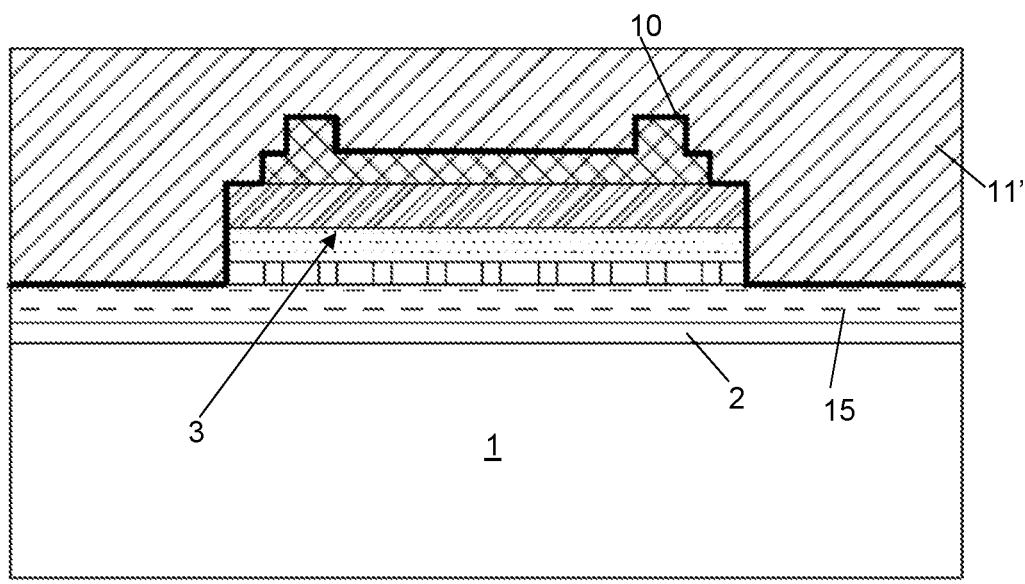
Figure 2G:
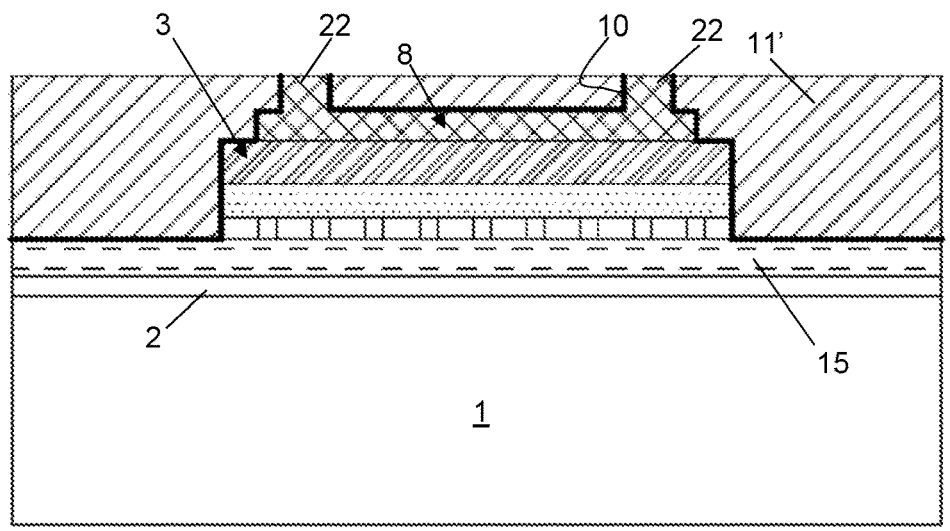
Figure 2H:
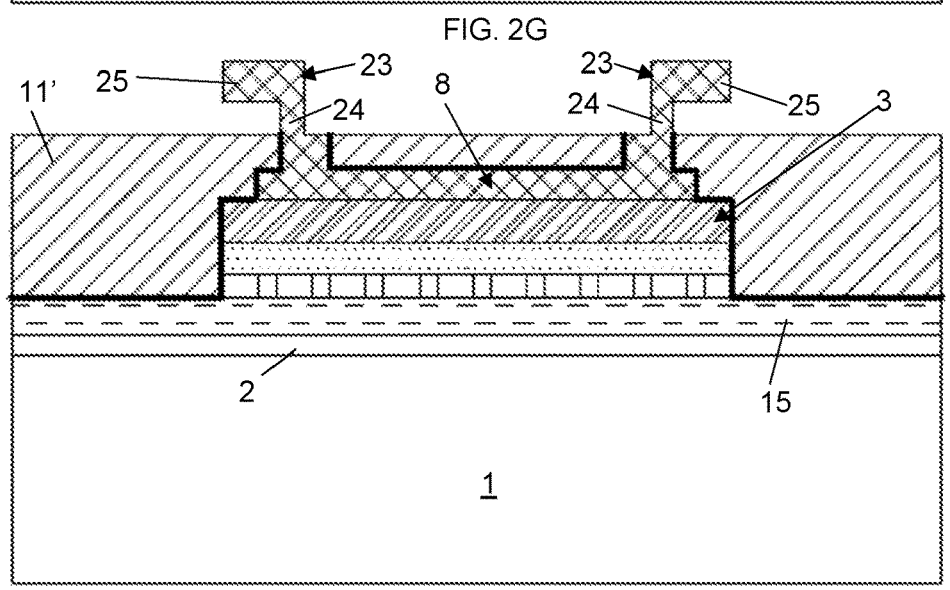

Another application of the method according to the disclosed technology is illustrated in FIGS. 2A to 2M. This time an RDL 15 is produced first on the surface of a temporary adhesive layer 2 attached to a carrier substrate 1, as illustrated in FIGS. 2A and 2B. As seen in FIG. 2C, a semiconductor die 3 is bonded to the RDL 15 by bonding the solder bumps of the die to suitable contact pads (not shown) on the upper layer of the RDL 15. A layer of underfill material 19 is applied, filling the space between the bumps 6. The underfill may be applied in any suitable manner, either during bonding of the die 3 or thereafter. In this example, the die 3 requires cooling by a microfluidic channel system. The method of the disclosed technology allows to produce such a channel system with channels which are protected on their inner surface by a protective layer. This is achieved by performing the method of the disclosed technology consecutively on a series of mold substrates, produced on top of each other. FIG. 2D shows the creation of a first 3D structure 8 of a sacrificial material, on the back surface of the die, for example by 3D printing. Structure 8 is a block 20 with a square shape as seen in the plane of the die, with two extensions 22. With reference to FIG. 2E, a layer 10 is then applied essentially conformally with the topography of the first 3D structure 8 and the die 3. As shown in FIG. 2F, a first overmolding step is done, i.e., application of a mold compound and curing to set the material, thereby creating a first mold substrate 11'. As shown in FIG. 2G, thinning of the first mold substrate 11' is done by grinding, to a degree that the upper surfaces of the extensions 22 are exposed. Then a pair of second 3D structures 23 of a sacrificial material is produced on the planarized surface of the first mold substrate 11', wherein the footprint of the second 3D structures 23 does not extend beyond the exposed surfaces of the extensions 22. See FIG. 2H.

Figure 2I:
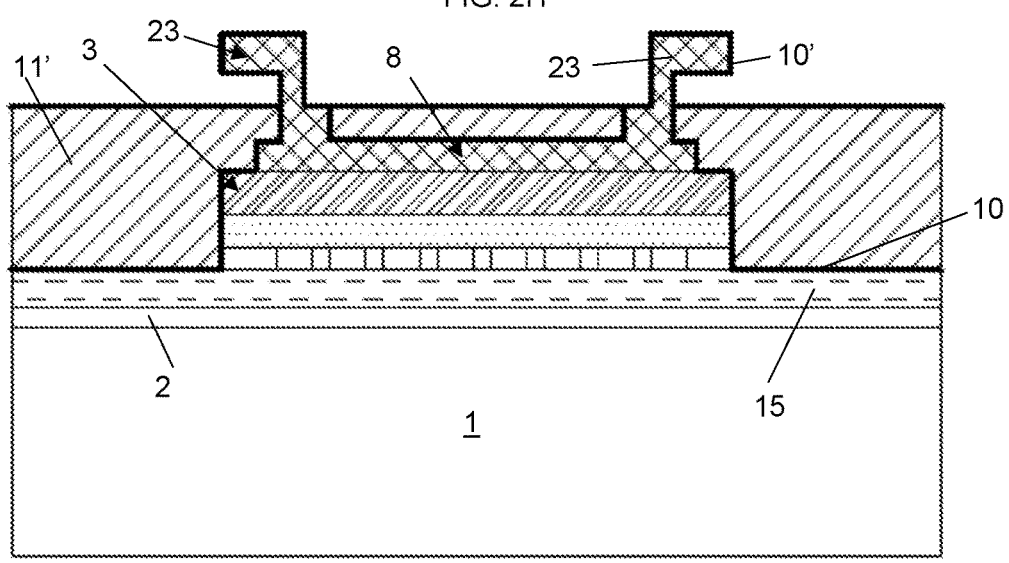
Figure 2J:
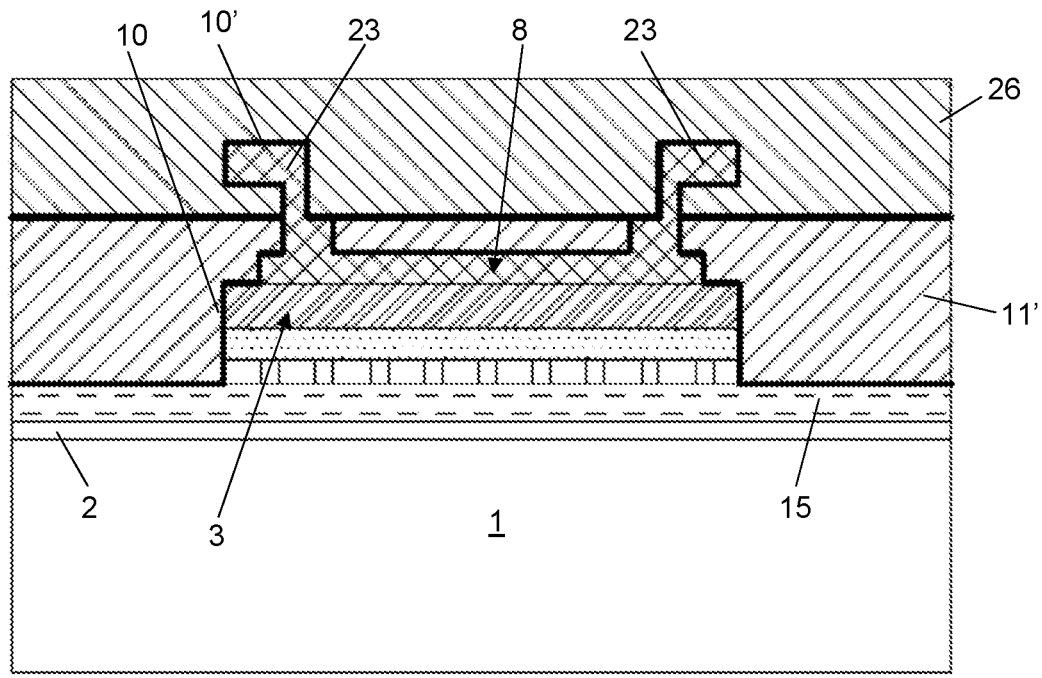
Figure 2K:
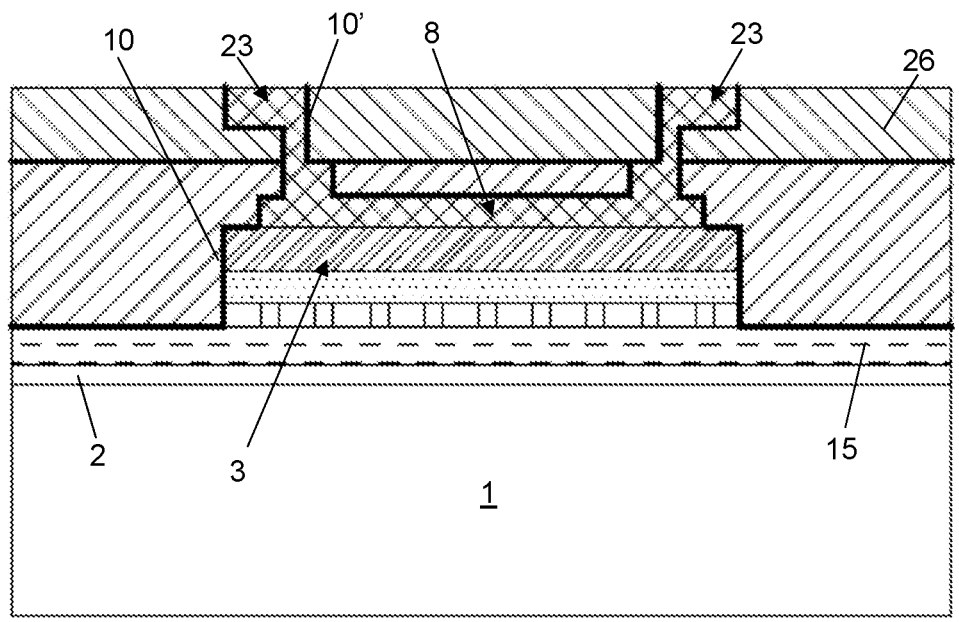
Figure 2L:
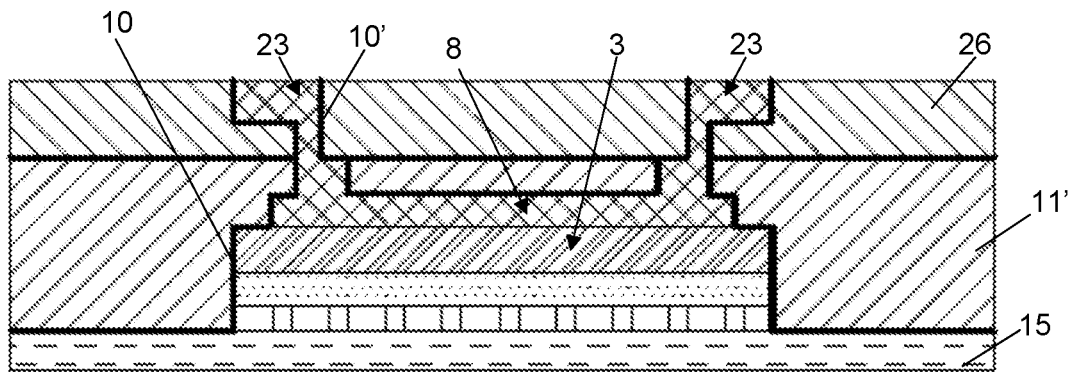
Figure 2M:
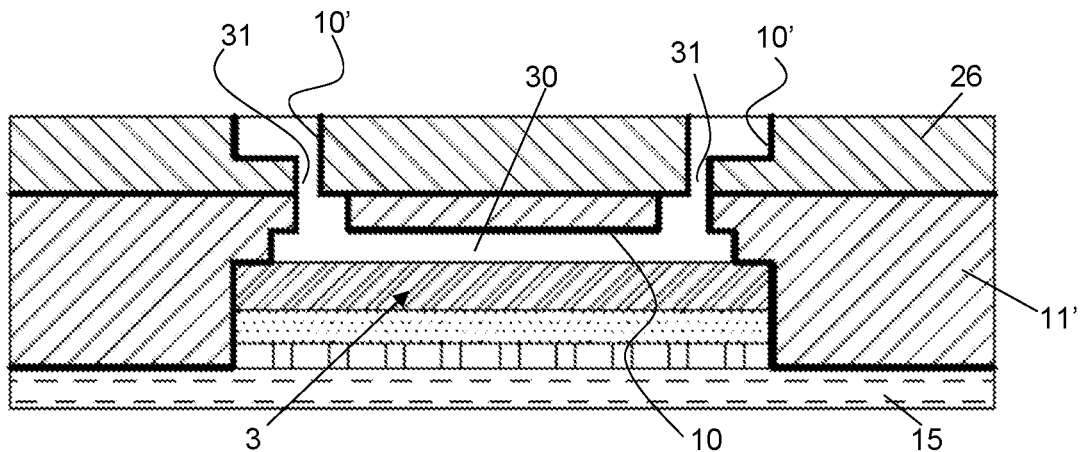

In the embodiment shown, the second 3D structures are columns 24 with a cross-section (as seen in the plane of the planarized surface of the first mold substrate 11') that is smaller than and that does not extend beyond the cross-section of the extensions 22. The second 3D structures 23 further include a transverse portion 25. This is followed again by application of a second conformal layer 10' as shown in FIG. 2I, in some cases of the same material as the first layer 10, and by a second overmolding step to form a second mold substrate 26 and grinding to thin the second mold substrate 26, until the upper surface of the structures 23 is exposed, as shown in FIGS. 2J and 2K. After releasing the reconstructed wafer formed by the stack of mold substrates 11' and 26 together with the RDL 15 from the carrier substrate 1 as shown in FIG. 2L), the sacrificial material is removed as shown in FIG. 2M, i.e., the sacrificial material is removed simultaneously from both mold substrates 11' and 26, through the exposed surfaces of the structures 23. A cavity is formed by removal of the structures 8 and 23. The cavity includes an open space 30 above the die 3 and a pair of channels 31 for supplying and removing a cooling fluid to and from the open space 30. The interior of the cavity 30, 31 is fully covered with the protective layer 10, 10'. This interior includes the vertical side walls of the cavity and the horizontal portions appearing as a consequence of the fact that the footprint of the columns 24 is fully within the exposed surface of the extensions 22.

Figure 3A:
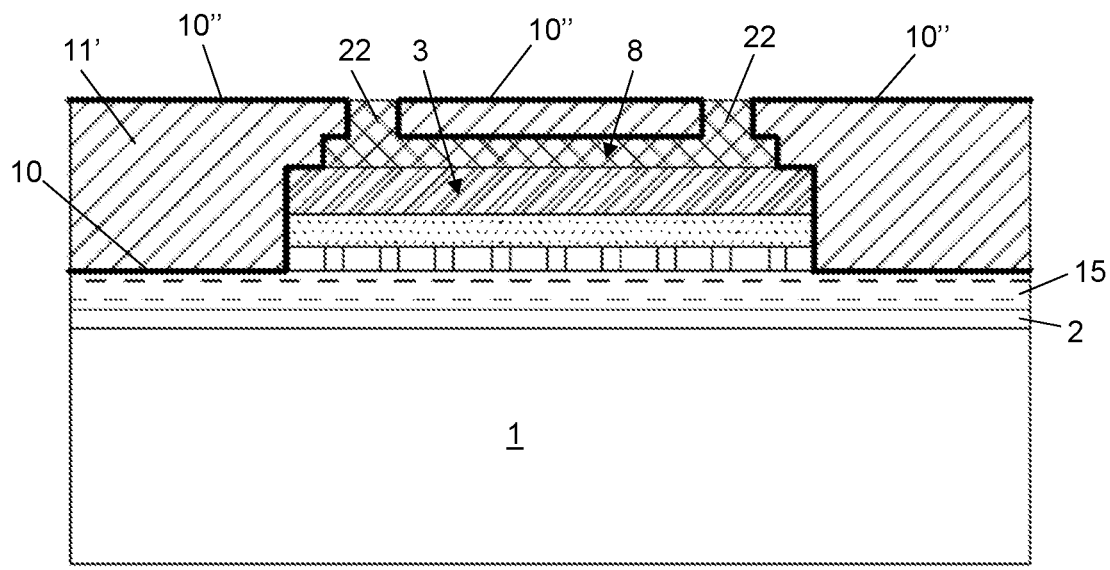
FIGS. 3A to 3D illustrate a method for forming a similar package as in FIGS. 2A to 2M, but wherein an intermediate layer is implemented to ensure that every surface of the mold material inside the cooling channels is covered by a thin layer.
Figure 3B:
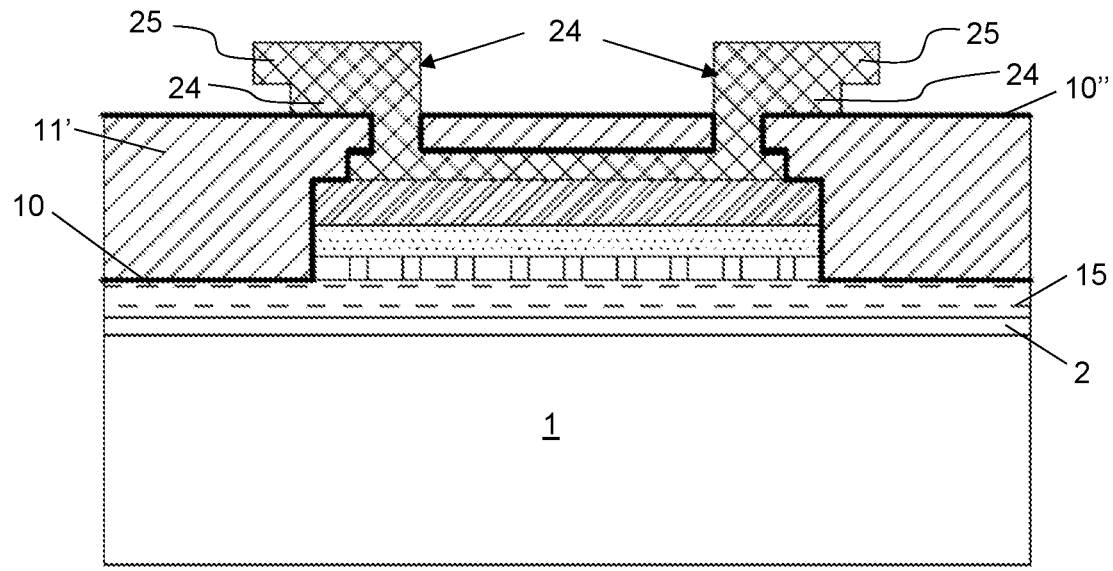
Figure 3C:
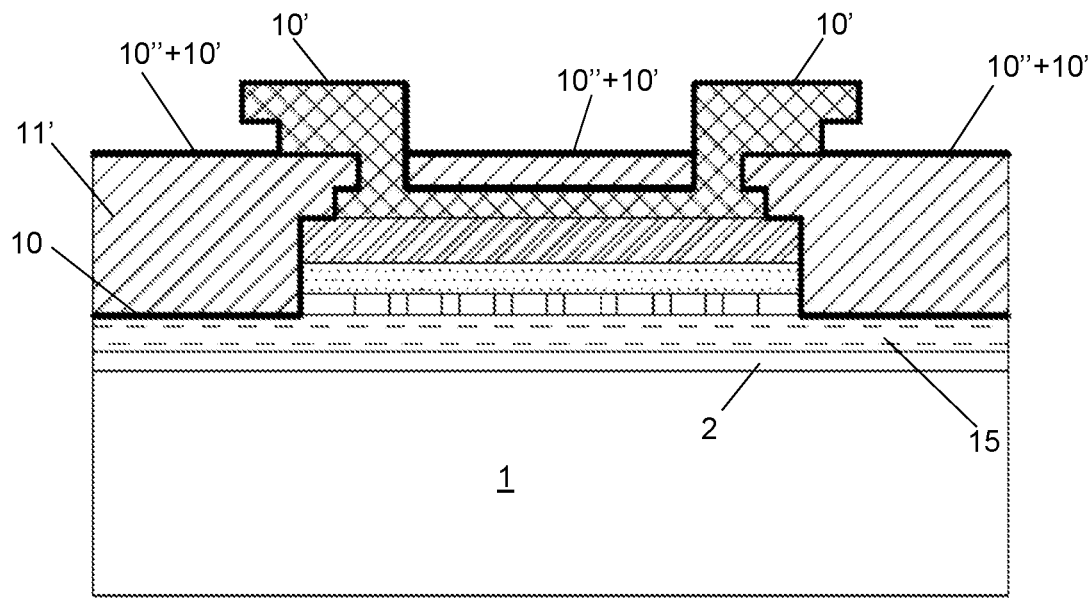
Figure 3D:
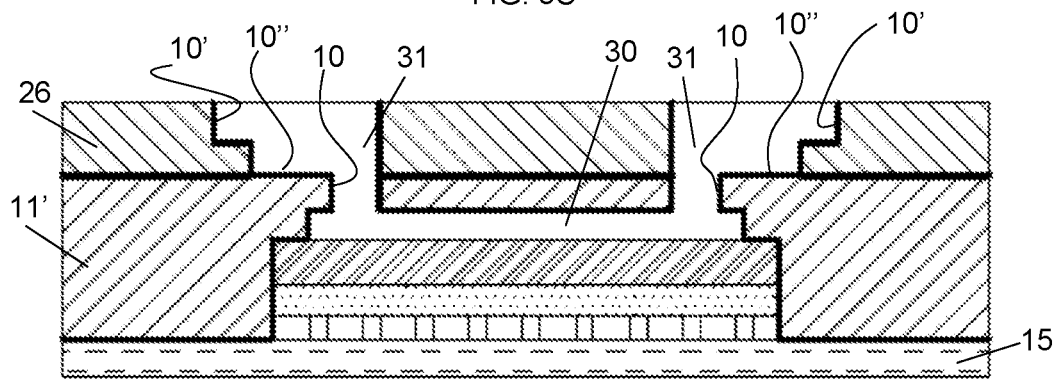

The disclosed technology is not limited to embodiments wherein the footprint of the additional sacrificial structure is fully within the exposed surface of a previous structure. When the footprint does extend beyond the exposed surface, additional method steps can be implemented to obtain a final cavity having the conformal layer on every surface of the mold substrates inside the cavity. An example of such an embodiment is shown in FIGS. 3A to 3D. The first steps according to this embodiment are the same as described above in relation to FIGS. 2A to 2G (i.e., until thinning of the first mold substrate 11'). FIG. 3A shows the application of an intermediate layer 10", on the thinned and planarized mold substrate 11'. The intermediate layer 10" is, however, not applied on the complete surface of the thinned mold substrate 11'. It is applied everywhere except on the exposed surfaces of the extensions 22 of the first sacrificial structure 8. This may be realized by depositing the layer 10" on the complete surface and removing it from the exposed surfaces by lithography and etching. The intermediate layer 10" is again a layer that is resistant to at least one removal technique for removing the sacrificial material of the structure 8 and the thereafter-to-be-formed sacrificial structures. The layer 10" can be of the same material and comparable thickness as the first conformal layer 10. After this, the two additional sacrificial structures 23 are produced, for example by 3D printing. See FIG. 3B. Again, these structures are formed of a column 24 and a transverse portion 25, but this time the footprint of the columns 24 covers the full area of the exposed surfaces of the extensions 22, and furthermore extends beyond the exposed surfaces. The part that extends beyond the exposed surfaces is formed on top of the intermediate layer 10". Then, as shown in FIG. 3C, the second conformal layer 10' is formed, as in the previous embodiment. On the surface of the first mold substrate 11' outside the exposed surfaces, the second conformal layer 10' is formed on top of the intermediate layer 10". The second mold substrate 26 is then formed, and subsequently thinned, until the upper surface of the structures 23 is exposed. After the release of the reconstructed wafer formed by the stack of mold substrates 11' and 26 together with the RDL 15 from the carrier substrate 1, the sacrificial material is removed, while the first and second conformal layers 10, 10' and the intermediate layer 10" are maintained, resulting in the cavity 30+31 shown in FIG. 3D. The mold material inside the cavity is fully covered by a thin layer, formed of portions of the first and second conformal layers 10 and 10', and of the intermediate layer 10".

Figure 4A:
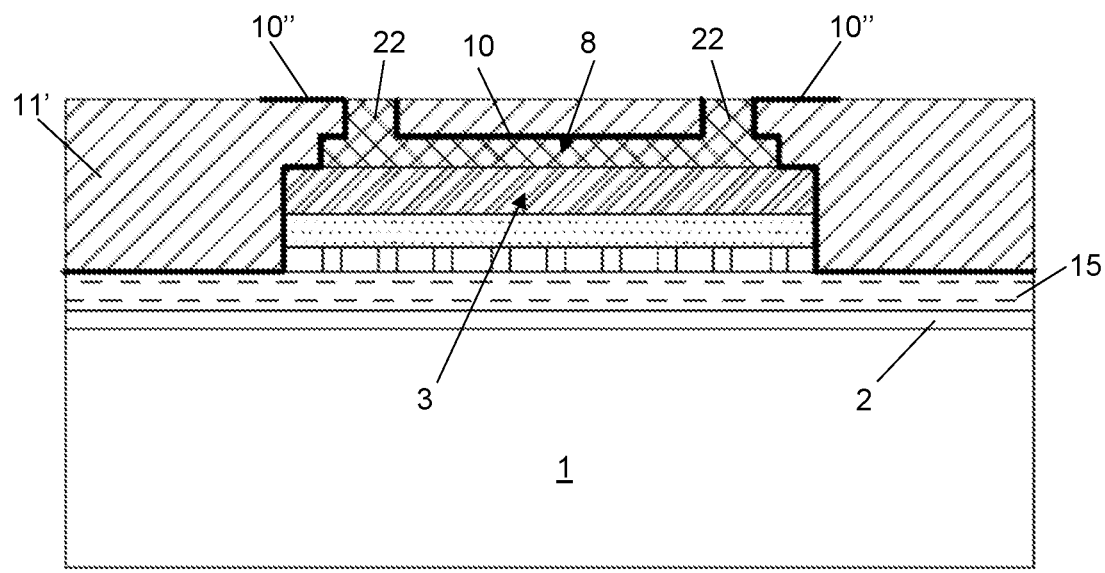
FIGS. 4A and 4B illustrate a method having the same result as the method of FIGS. 3A to 3D, but involving a more targeted deposition of the intermediate layer.
Figure 4B:
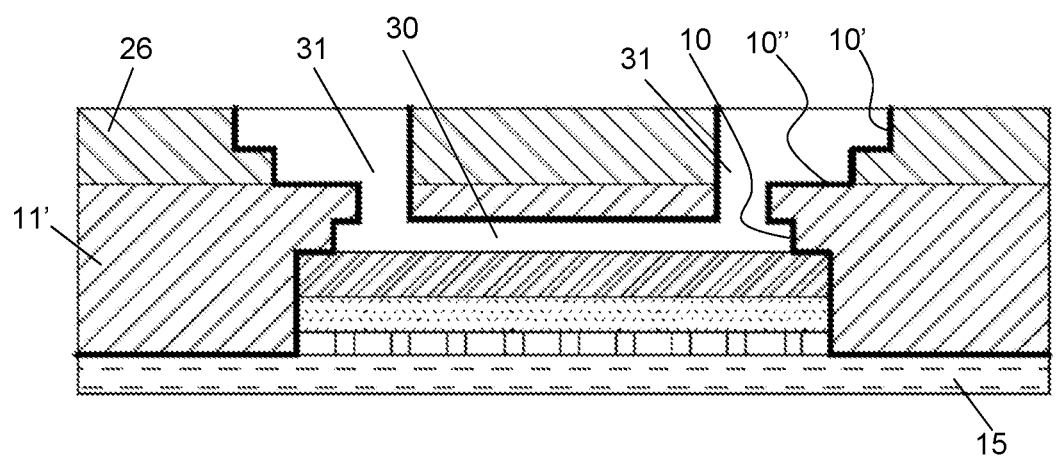

It is also possible to form the intermediate layer 10" only on the areas where the additional sacrificial structures 23 extend beyond the exposed surfaces of the extensions 22. This is illustrated in FIG. 4A. The intermediate layer portions 10" may be formed by depositing the layer on the full surface and removing it everywhere except on the targeted areas, by lithography and etching. The formation of the additional structures 23, the second conformal layer 10' and the second mold substrate 26 takes place in the same manner as in the previous embodiments, as well as the release of the reconstructed wafer and the removal of the sacrificial material, resulting again in the cavity 30+31 having a thin layer 10, 10' or 10" on every surface of the mold substrates 11' and 26 inside the cavity. In the embodiments where the intermediate layer 10" is implemented, this intermediate layer 10" forms a part of the final conformal layer that covers every surface of the mold substrate or substrates of the cavity formed by the removal of the sacrificial material.

In any of the embodiments illustrated in FIGS. 2A-2M, 3A-3D, and 4A-4B, the resulting cavity 30+31 is an example of a fluid channel network created by the method of the disclosed technology. More intricate networks can be created by using more complex shapes of the sacrificial structures, and/or by applying the method to more than two mold substrates.

Indeed, the method as described above for the case of two mold substrates 11' and 26 may be extended to a higher number of mold substrates. Each time, sacrificial structures are formed on the previous thinned mold substrate. If the footprint of the newly formed structures extends beyond the exposed surface of a structure embedded in the previous mold substrate, an intermediate layer 10" is implemented. Otherwise such a layer is not required. Each time, the newly-formed sacrificial structures are covered by a conformal layer. The removal of the sacrificial structures takes place for all the stacked mold substrates simultaneously after the thinning of the last mold substrate, thereby removing the conformal layer from the upper surface of the structures embedded in the last mold substrate. Removal of the structures through the exposed upper surface thereby creates an aggregate cavity extending across the stack.

Implementations of the disclosed technology can include any number of the above-described features. The conformal layers 10, 10' may be applied only on the sacrificial structures 8, 23 and not on the surrounding surface, or not on the totality of the surrounding surface. This could be realized, for example, by depositing the layer 10 on the complete surface and then patterning the layer by lithography and etching, or by masking the area around the patch 8 before depositing the layer 10. The thinning step may be performed by other suitable methods instead of by planarization through grinding and/or CMP. The thinning could be local, performed by lithography and etching in an area including the sacrificial structures which are to be removed. Etching is then performed until an upper surface of such a sacrificial structure is exposed.

The disclosed technology is related to a package obtainable by the methods according to any of the described embodiments. Such a package includes one or more semiconductor dies 3 embedded in a mold material, wherein the package includes one or more open cavities in the mold material, the cavities including a conformal layer on the mold material surfaces of the cavities. The mold material is a portion of a mold substrate or a stack of mold substrates obtainable by singulation of a reconstructed wafer formed by overmolding. The one or more cavities are open in the sense that they are open to an outer surface of the cavity, the outer surface corresponding to the upper surface of the reconstructed wafer. The conformal layer can be a protective layer, such as a moisture barrier.

When it is stated that the conformal layer "covers every surface of the mold substrate inside the cavity", it will be understood that no conformal layer is necessarily present on the bottom of the cavity, or for example on the side surface of a fixed structure onto which the sacrificial structure is produced in an overlapping manner. In the above-described embodiments there is effectively no conformal layer on the bottom of the cavities 16 or 30+31. For example, the cavity 30+31 in FIG. 2M includes the layer 10+10' on its vertical sidewalls, as well as on its horizontal portions, but not on the bottom of the cavity. A conformal layer may, however, be present also on the bottom of the cavity (unless of course a direct contact to a surface in the package is implemented, as in the case of the biochip of FIG. 1I). This is achieved by forming a preliminary conformal layer on the base substrate prior to forming the first sacrificial structure. The preliminary layer is equally resistant to at least one removal technique for removing the sacrificial material. Removal of the structure will then leave the conformal layer on the bottom of the cavity.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of packaging one or more semiconductor dies, the method comprising providing a base substrate and thereafter performing one or more overmolding steps on the base substrate to produce one mold substrate or a stack of mold substrates on the base substrate, wherein the one or more semiconductor dies are embedded in the one mold substrate or the stack of the mold substrates, the method further comprising:

providing one or more 3-dimensional structures of a sacrificial material on a surface of the base substrate, the base substrate comprising a carrier substrate and a temporary adhesive layer on the carrier substrate, the base substrate further comprising a redistribution layer that is removably attached to the temporary adhesive layer and the one or more semiconductor dies, the dies being removably attached to the temporary adhesive layer;

forming a conformal layer at least on the one or more 3-dimensional structures;

performing a first overmolding step, thereby embedding the one or more 3-dimensional sacrificial structures in a first mold substrate;

thinning at least part of the first mold substrate, thereby removing the conformal layer from an upper surface of the one or more 3-dimensional structures, thereby exposing a surface of the one or more 3-dimensional structures; and removing the sacrificial material of the one or more 3-dimensional structures whose upper surfaces are exposed, while maintaining the conformal layer, thereby obtaining one or more cavities in the first mold substrate, wherein the conformal layer covers every surface of the first mold substrate inside the one or more cavities.

2. The method according to claim 1, wherein the base substrate further comprises a conformal layer at least on an area where the one or more 3-dimensional structures are formed, and wherein the conformal layer on the area where the one or more 3-dimensional structure are formed remains after the removal of the one or more 3-dimensional structures.

3. The method according to claim 1, further comprising, after thinning and before removing the sacrificial material:

providing one or more additional 3-dimensional structures formed of a sacrificial material on a thinned surface of the first mold substrate, in direct contact with an exposed surface of a previous 3-dimensional structure embedded in the first mold substrate, wherein a footprint of the one or more additional 3-dimensional structures does not extend beyond the exposed surface of the previous 3-dimensional structure;

forming an additional conformal layer, at least on the one or more additional 3-dimensional structures and on any exposed surface of the previous 3-dimensional structure or structures not contacted directly by the one or more additional 3-dimensional structures;

performing a second overmolding step, thereby embedding the one or more additional 3-dimensional structures in a second mold substrate produced on the first mold substrate;

thinning at least part of the second mold substrate, thereby removing at least the additional conformal layer from an upper surface of the one or more additional 3-dimensional structures; and optionally repeating the above steps on the second mold substrate and optionally on one or more subsequent mold substrates, wherein removing the sacrificial material of the one or more 3-dimensional structures and the one or more additional 3-dimensional structures takes place simultaneously for the first and second mold substrates and optional subsequent mold substrates, thereby creating at least one aggregate cavity extending across the first and second mold substrates and optional subsequent mold substrates, and wherein a conformal layer covers every surface of the first and second mold substrates and optional subsequent mold substrates, inside the aggregate cavity.

4. The method according to claim 3, wherein the aggregate cavity forms a fluid channel network.

5. The method according to claim 4, wherein the fluid channel network is configured for supplying a cooling liquid to the one or more semiconductor dies.

6. The method according to claim 1, further comprising, after thinning and before removing the sacrificial material:
- forming an intermediate layer on a thinned surface of the first mold substrate, the intermediate layer covering at least one area extending beyond the exposed surface of the one or more 3-dimensional structures formed of sacrificial material, while not covering any exposed surface of the one or more 3-dimensional structures;
- providing one or more additional 3-dimensional structures formed of a sacrificial material on the thinned surface of the first mold substrate, in direct contact with an exposed surface of a previous 3-dimensional structure embedded in the first mold substrate, wherein an extending part of a footprint of the one or more additional 3-dimensional structures extends beyond the exposed surface of the previous 3-dimensional structure, and wherein the extending part of the footprint is formed on the intermediate layer;
- forming an additional conformal layer, at least on the one or more additional 3-dimensional structures and on any exposed surface of the previous 3-dimensional structure or structures not contacted directly by the one or more additional 3-dimensional structures;
- performing a second overmolding step, thereby embedding the one or more additional 3-dimensional structures in a second mold substrate produced on the first mold substrate;
- thinning at least part of the second mold substrate, thereby removing at least the additional conformal layer from an upper surface of the one or more additional 3-dimensional structures; and
- optionally repeating the above steps on the second mold substrate and optionally on one or more subsequent mold substrates,
- wherein removing the sacrificial material of the one or more 3-dimensional structures and the one or more additional 3-dimensional structures takes place simultaneously for the first and second mold substrates and optional subsequent mold substrates, thereby creating at least one aggregate cavity extending across the first and second mold substrates and optional subsequent mold substrates, and wherein a conformal layer covers every surface of the first and second mold substrate and optional subsequent mold substrates, inside the aggregate cavity.

7. The method according to claim 1, wherein thinning includes grinding a surface of the first mold substrate.

8. The method according to claim 1, wherein providing the one or more 3-dimensional structures comprises 3D printing the one or more 3-dimensional structures.

9. The method according to claim 1, wherein the conformal layer is a moisture barrier.

10. A method of packaging one or more semiconductor dies, the method comprising providing a base substrate and thereafter performing one or more overmolding steps on the base substrate to produce one mold substrate or a stack of mold substrates on the base substrate, wherein the one or more semiconductor dies are embedded in the one mold substrate or the stack of the mold substrates, the method further comprising:
- providing one or more 3-dimensional structures of a sacrificial material on a surface of the base substrate;
- forming a conformal layer at least on the one or more 3-dimensional structures;
- performing a first overmolding step, thereby embedding the one or more 3-dimensional sacrificial structures in a first mold substrate;
- thinning at least part of the first mold substrate, thereby removing the conformal layer from an upper surface of the one or more 3-dimensional structures, thereby exposing a surface of the one or more 3-dimensional structures; and
- removing the sacrificial material of the one or more 3-dimensional structures whose upper surfaces are exposed, while maintaining the conformal layer, thereby obtaining one or more cavities in the first mold substrate, wherein the conformal layer covers every surface of the first mold substrate inside the one or more cavities, the method further comprising, after thinning and before removing the sacrificial material:
- providing one or more additional 3-dimensional structures formed of a sacrificial material on a thinned surface of the first mold substrate, in direct contact with an exposed surface of a previous 3-dimensional structure embedded in the first mold substrate, wherein a footprint of the one or more additional 3-dimensional structures does not extend beyond the exposed surface of the previous 3-dimensional structure;
- forming an additional conformal layer, at least on the one or more additional 3-dimensional structures and on any exposed surface of the previous 3-dimensional structure or structures not contacted directly by the one or more additional 3-dimensional structures;
- performing a second overmolding step, thereby embedding the one or more additional 3-dimensional structures in a second mold substrate produced on the first mold substrate;
- thinning at least part of the second mold substrate, thereby removing at least the additional conformal layer from an upper surface of the one or more additional 3-dimensional structures; and
- optionally repeating the above steps on the second mold substrate and optionally on one or more subsequent mold substrates,
- wherein removing the sacrificial material of the one or more 3-dimensional structures and the one or more additional 3-dimensional structures takes place simultaneously for the first and second mold substrates and optional subsequent mold substrates, thereby creating at least one aggregate cavity extending across the first and second mold substrates and optional subsequent mold substrates, and wherein a conformal layer covers every surface of the first and second mold substrate and optional subsequent mold substrates, inside the aggregate cavity.

11. The method according to claim 10, wherein the base substrate comprises a carrier substrate and a temporary adhesive layer on the carrier substrate.

12. The method according to claim 11, wherein the base substrate further comprises the one or more semiconductor dies, the dies being removably attached to the temporary adhesive layer.

13. The method according to claim 11, wherein the base substrate further comprises a redistribution layer that is removably attached to the temporary adhesive layer and the one or more semiconductor dies, the dies being bonded to the redistribution layer.

14. The method according to claim 10, wherein the base substrate further comprises a conformal layer at least on an area where the one or more 3-dimensional structures are formed, and wherein the conformal layer on the area where the one or more 3-dimensional structure are formed remains after the removal of the one or more 3-dimensional structures.

15. The method according to claim 10, wherein the aggregate cavity forms a fluid channel network.

16. The method according to claim 15, wherein the fluid channel network is configured for supplying a cooling liquid to the one or more semiconductor dies.

17. The method according to claim 10, wherein thinning includes grinding a surface of the first mold substrate.

18. The method according to claim 10, wherein providing the one or more 3-dimensional structures comprises 3D printing the one or more 3-dimensional structures.

19. The method according to claim 10, wherein the conformal layer is a moisture barrier.

* * * * *